(12) United States Patent
Chuang

(10) Patent No.: US 6,497,398 B1
(45) Date of Patent: Dec. 24, 2002

(54) SUPPORT USING GUIDE SLIDER FOR INTERFACE CARD

(75) Inventor: Yung-Shun Chuang, Hsin-Tien (TW)

(73) Assignee: Aaeon Technology Inc., Taipei (TW)

( * ) Notice: Subject to any disclaimer, the term of this patent is extended or adjusted under 35 U.S.C. 154(b) by 0 days.

(21) Appl. No.: 09/988,549

(22) Filed: Nov. 20, 2001

(51) Int. Cl.⁷ .............................................. A47G 29/00
(52) U.S. Cl. ....................................... 248/694; 361/684
(58) Field of Search ......................... 248/694; 361/684, 361/685, 736; 360/137

(56) References Cited

U.S. PATENT DOCUMENTS

| | | | | |
|---|---|---|---|---|
| 5,121,295 A | * | 6/1992 | Lam | 361/894 |
| 5,708,552 A | * | 1/1998 | Han et al. | 361/799 |
| 6,115,250 A | * | 9/2000 | Schmitt | 361/395 |
| 6,307,754 B1 | * | 10/2001 | Le et al. | 361/796 |

FOREIGN PATENT DOCUMENTS

GB  2292820 A  *  3/1996

* cited by examiner

Primary Examiner—Ramon O. Ramirez
(74) Attorney, Agent, or Firm—Bacon & Thomas

(57) ABSTRACT

An arrangement for fixing an interface card in an expansion slot includes a guide member fixed transversely across the expansion slot. The guide member includes an elongated slide slot arranged to slidably receive a plurality of sliders. A respective adjustment screw is threaded through each of the sliders, and a clamping plate is threaded onto the end of each of the adjustment screws. Each clamping plate includes a grooved bottom that fits over an interface card to secure it in the expansion slot when the clamping plate is vertically positioned by turning the adjustment screw, and horizontally positioned by sliding the corresponding slider in the slide slot.

1 Claim, 4 Drawing Sheets

SUPPORT USING GUIDE SLIDER FOR INTERFACE CARD

BACKGROUND OF THE INVENTION

1. Field of the Invention

The present invention relates to an apparatus that enables different types of interface cards to be installed in expansion slots of an industrial computer.

2. Description of Related Art

Referring to FIG. 1, a conventional interface card (B) located in an expansion slot is first inserted into a fixed support (Al) and then fastened by means of a fixture that extends downwardly from the top of the expansion slot. The fixture includes a fixing support (C) with a hole (C1), and is secured to sides of the expansion slot (A). The interface card is fixed by a fixing block (C2) fastened to the fixing support (C) by a pair of screws (C3) extending through the hole (C1) and nuts (C4) threaded onto the screws.

A disadvantage of the structure of fixing block (C2) is that it can only be fixed to a single type of interface card (B). This is because its hole (C1) is made in advance according to the number of interface cards (B) that are to be fixed in the expansion slot. During installation, the interface card (B) is fixed by the fixing block (C2) using the pair of screws (C3), nuts (C4), and hole (C1). Because the position of the fixing block is restricted by the specific number and arrangement of holes, only a single type of interface card (B) can be installed in the expansion slot (A), using a single installation method. As a result, the conventional expansion slot arrangement lacks diversification and multiple functions.

In addition, it is impossible to fix the interface card without opening the slot in advance. If it is necessary to change the interface card (B), the only way is to select the same type of card, resulting in the further problem that the card might be difficult to fix or no longer available, compounding the difficulties in assembling and disassembling.

SUMMARY OF THE INVENTION

The invention provides a pressing plate which can easily be modified to accommodate different interface card height specifications.

Another contribution of this invention is to provide a large fixing area for an interface card that makes it easy to fix types and numbers of interface cards in an expansion slot.

DETAILED DESCRIPTION OF THE PREFERRED EMBODIMENT

Figure 1:
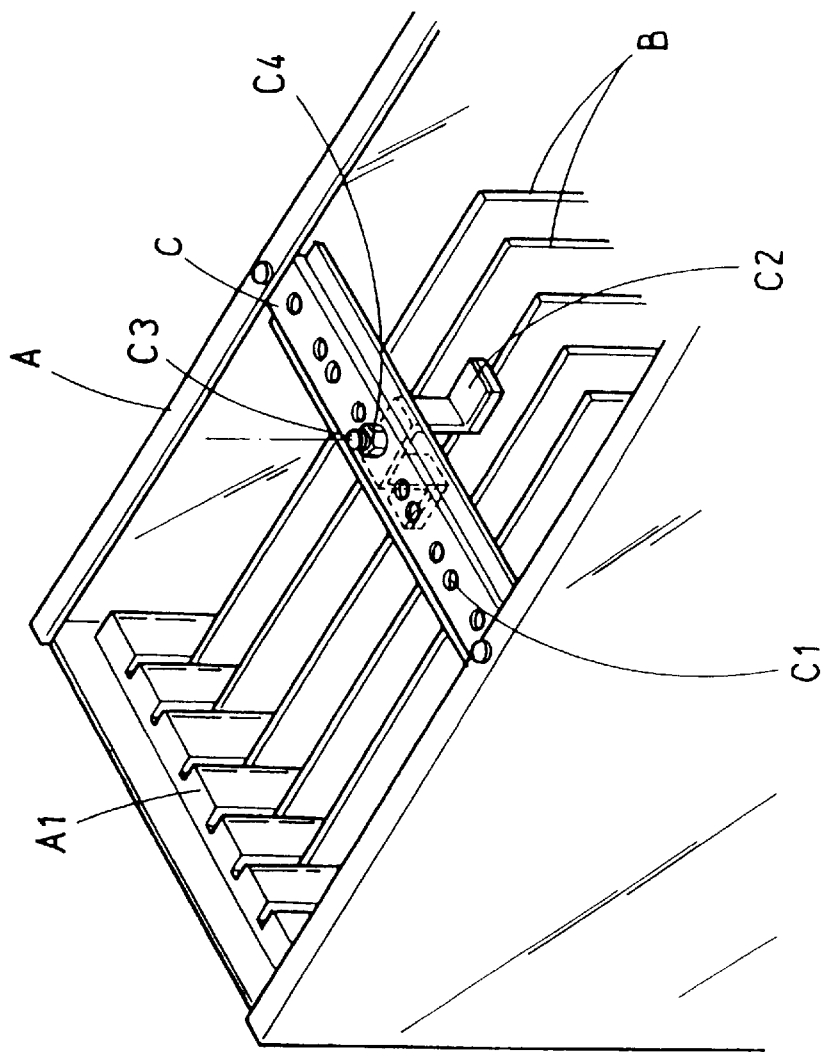
FIG. 1 is an isometric view of a conventional interface card fixing arrangement.
Figure 2:
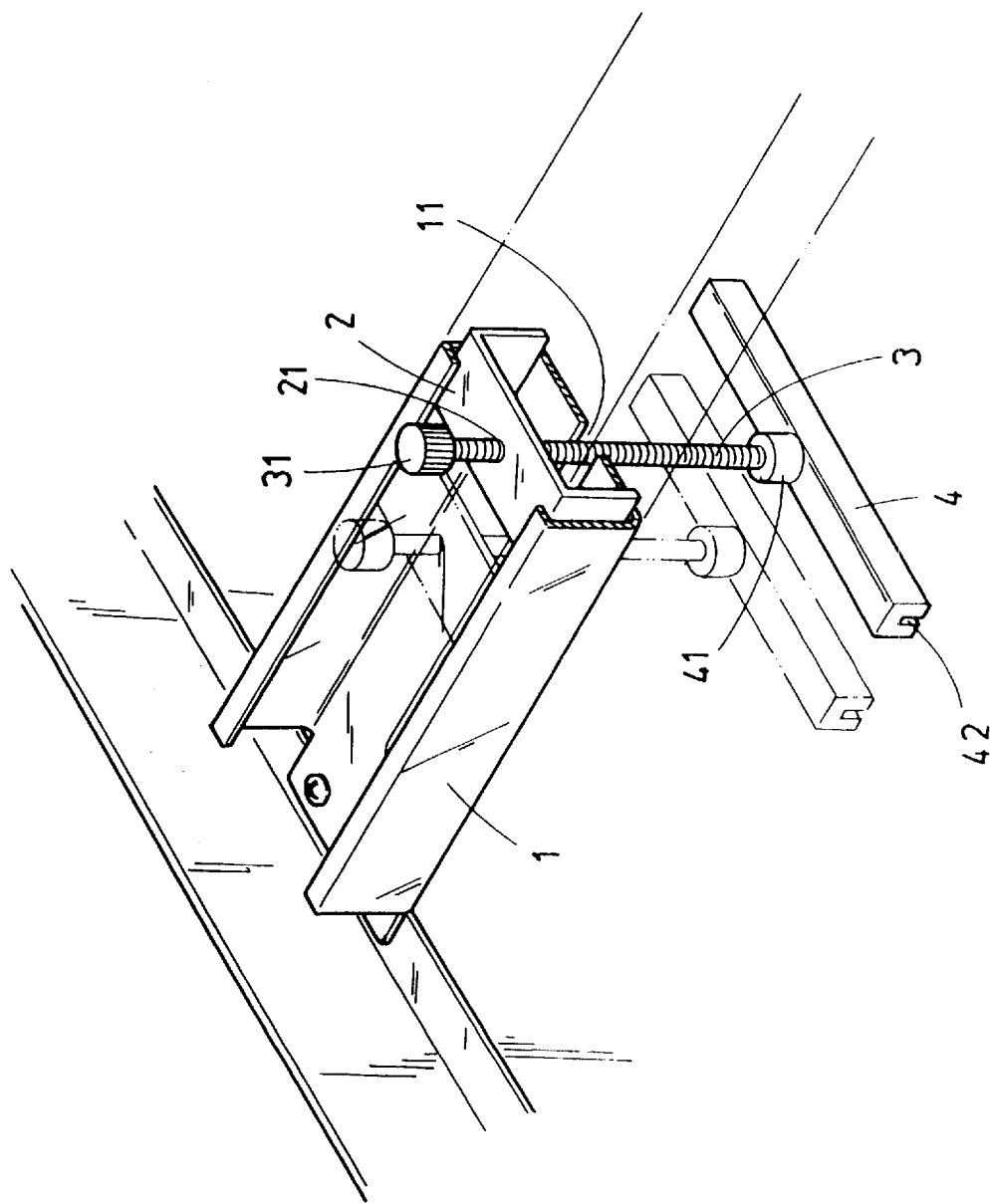
FIG. 2 is an isometric view of a fixing arrangement constructed in accordance with the principles of a preferred embodiment of the present invention.
Figure 3:
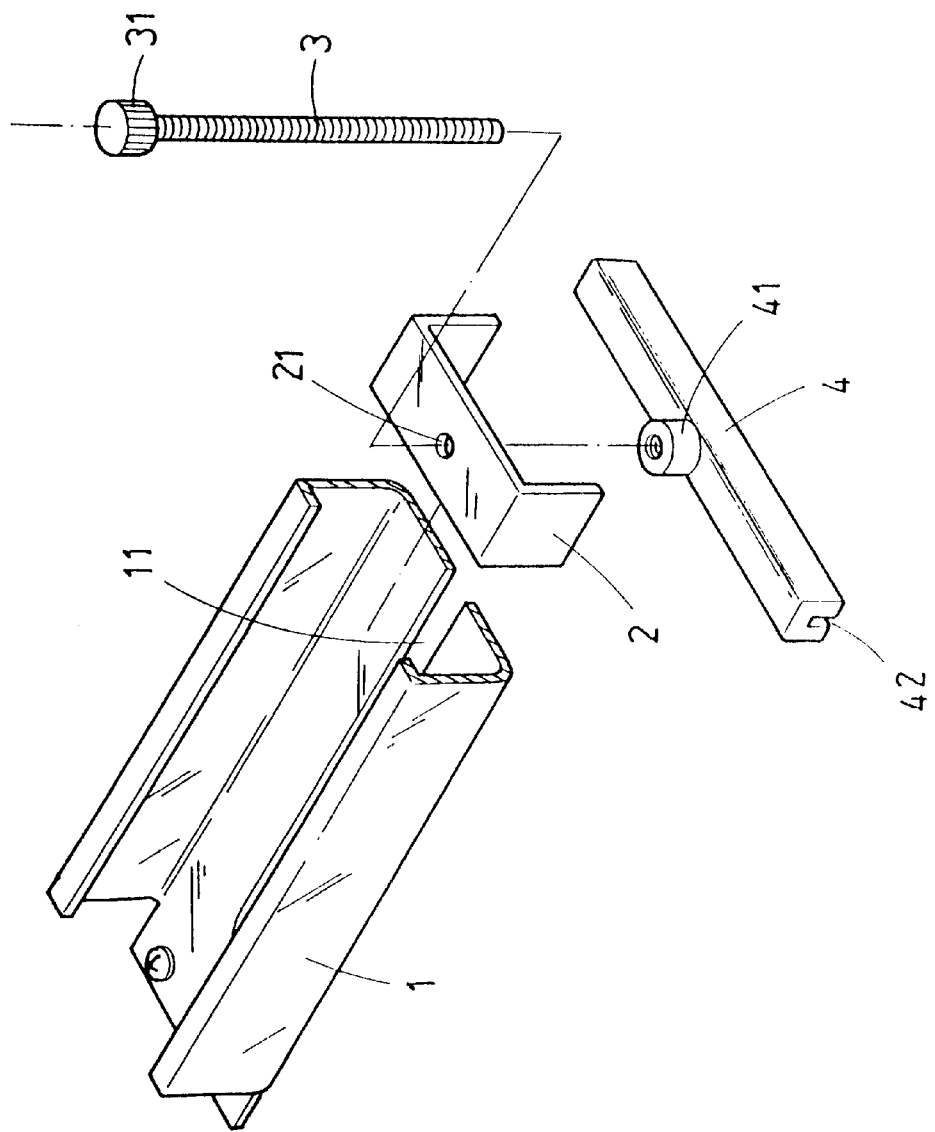
FIG. 3 is an exploded isometric view of the fixing arrangement of FIG. 2.
Figure 4:
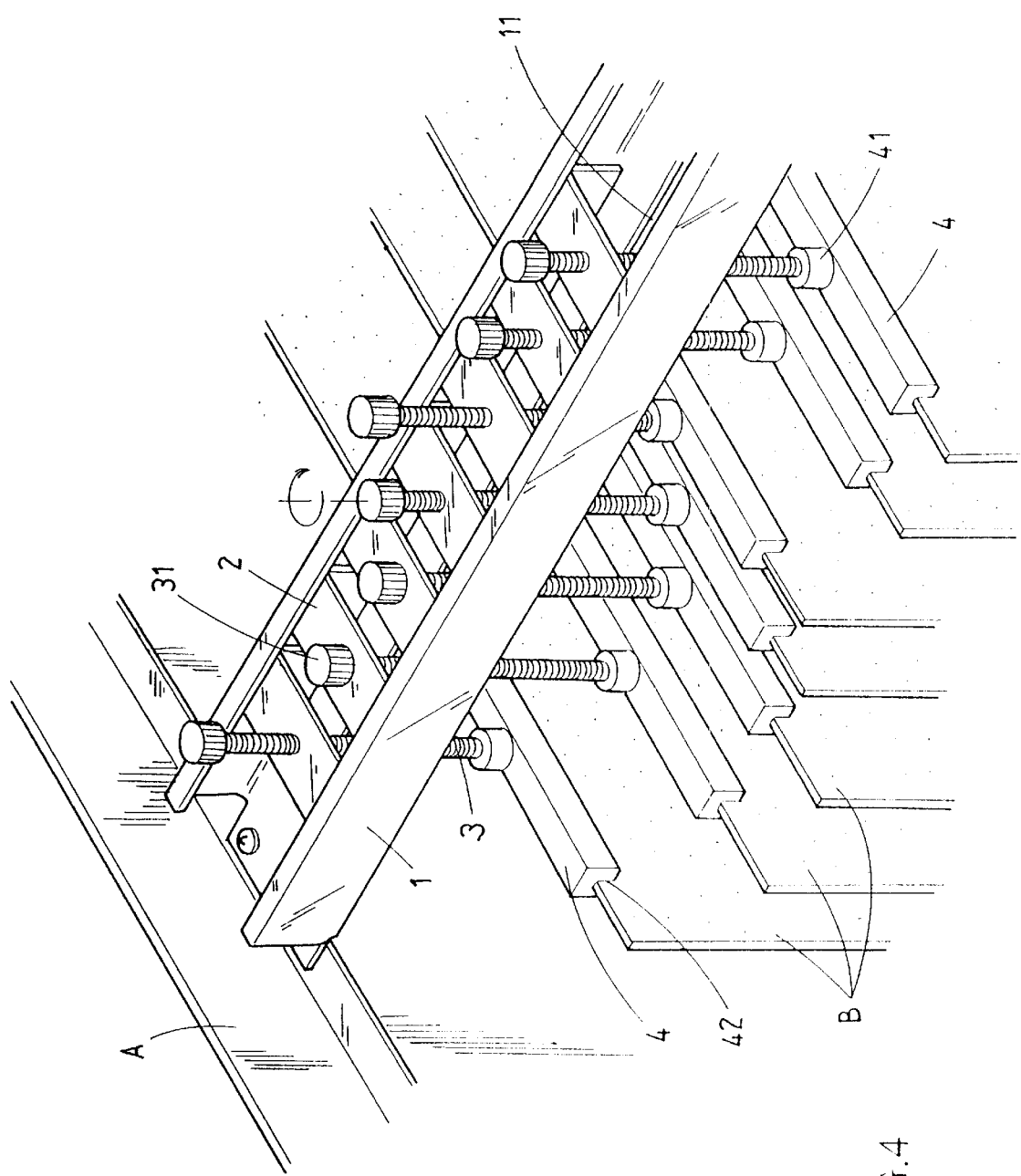
FIG. 4 is an isometric view of an installation utilizing the fixing arrangement of FIGS. 2 and 3.

Referring to FIG. 1 and FIG. 2, a guide member (1) having a ⊔ shape cross-section that forms an elongated slide slot is mounted inside an expansion slot in a transverse direction. On the top of the ⊔ shape is an inwardly extending flange to define a space into which can be put several sliders (2). Each slider (2) has a ⊓ shape with a threaded hole (21) and can be put inside the slide slot of the guide member (1). A respective adjustment shaft (3) extends perpendicularly relative to each of the sliders.

The adjustment shaft (3) has a thread on it, and is able to connect with a clamping plate (4) after passing through the slider (2) and the slide slot of the guide member (1).

The clamping plate (4) has a screw hole block (41) on top for receiving the threaded adjustment shaft (3). Clamping plate (4) also has a groove (42) at the bottom and is elongated.

Several sliders (2) are placed in the slide slot of the guide member (1) of the expansion slot (A) in advance. To install the interface card (B), the interface card is first fixed to a fixed support as in the conventional arrangement, and then is clamped by the clamping plate (4) using the adjustment shaft (3) to vertically adjust the position of the clamping plate, and the slide slot of the guide member (1) and slider (2) to horizontally adjust the position of the clamping plate, so that the interface card fits into the groove is (42) and is fixed firmly in the expansion slot (A).

Therefore, alignment of the slider (2) to the correct position by moving the adjustment shaft (3) along the elongated slide slot in the guide member (1) is very convenient and rapid. The invention makes great progress as compared with the currently used structure, which needs to be taken off at first and then fixed with a screw as shown in FIG. 1.

What is claimed is:

1. An arrangement for supporting an interface card in an expansion slot of a computer, comprising:

a guide member having a ⊔ shape cross-section and inwardly extending flanges at top ends of the ⊔ shape to define an elongated slide slot, the guide member being fixed transversely across the expansion slot;

a plurality of sliders slidably received in said slide slot, each of said sliders having ⊓ shape and a threaded hole;

a plurality of threaded adjustment shafts extending transversely to said guide member, each of said adjustment shafts being threaded into a respective threaded hole of a corresponding slider;

a plurality of clamping plates, each of said clamping plates being threaded onto an end of a respective adjustment shaft and including an elongated bottom groove arranged to fit over an interface card when a respective one of said clamping plates is positioned by sliding said slider within said groove and by turning said adjustment screw until said groove fits over the interface card.

* * * * *